United States Patent
Amundson et al.

(10) Patent No.: US 8,438,514 B2
(45) Date of Patent: May 7, 2013

(54) CLOCK ALIAS FOR TIMING ANALYSIS OF AN INTEGRATED CIRCUIT DESIGN

(75) Inventors: Michael D. Amundson, Oronoco, MN (US); Craig M. Darsow, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/449,139

(22) Filed: Apr. 17, 2012

(65) Prior Publication Data

US 2012/0204138 A1 Aug. 9, 2012

Related U.S. Application Data

(63) Continuation of application No. 12/770,420, filed on Apr. 29, 2010, now Pat. No. 8,250,515.

(51) Int. Cl.
*G06F 9/445* (2006.01)
*G06F 17/50* (2006.01)

(52) U.S. Cl.
USPC ............ 716/108; 716/106; 716/111; 716/134

(58) Field of Classification Search .................. 716/106, 716/108, 111, 134
See application file for complete search history.

(56) References Cited

U.S. PATENT DOCUMENTS

2005/0273738 A1 * 12/2005 Byrn et al. .................. 716/4

* cited by examiner

*Primary Examiner* — Thuan Do
*Assistant Examiner* — Brian Ngo
(74) *Attorney, Agent, or Firm* — Martin & Associates, LLC; Derek P. Martin

(57) ABSTRACT

A timing analysis mechanism allows defining a clock alias that correlates a clock that is not present in an integrated circuit design to a real clock in the integrated circuit design. In a first implementation, when an existing user assertion references a clock alias, the timing analysis mechanism generates a new user assertion that references the real clock specified in the clock alias. The new user assertion is then used in the timing analysis and the existing user assertion is not. In a second implementation, when an existing user assertion references a clock alias, the timing analysis mechanism generates a duplicate clock in the timing database, preserving all its attributes, and then passes the assertion using the alias name as well as any assertions using the corresponding real clock name to the timing engine to be used in the timing analysis.

2 Claims, 7 Drawing Sheets create_alias CLKA CLKB

CLOCK ALIAS FOR TIMING ANALYSIS OF AN INTEGRATED CIRCUIT DESIGN

BACKGROUND

1. Technical Field

This disclosure generally relates to integrated circuits, and more specifically relates to timing analysis of integrated circuit designs.

2. Background Art

The proliferation of modern electronics is due in large part to the development of the integrated circuit. Integrated circuits allow many different circuit elements to be implemented on a single chip. As technology advances, the number of circuit elements on a chip of a given size increases, enhancing the performance and reducing the cost of integrated circuits.

The design of integrated circuits is typically performed in three stages. The first stage is logic design, wherein the desired operation of the integrated circuit is defined. The second stage is logic synthesis, wherein the desired operation is translated into the required circuit elements for a given technology. The third stage is physical design, which assigns the placement of these elements and routing which creates the wire interconnect of these elements on the integrated circuit. Placement defines the location of the circuit elements on the integrated circuit. Routing defines interconnections between circuit elements.

At the logic synthesis stage, a static timing tool is typically used to perform a static timing analysis. Static timing analysis generally takes into account best-case and worst-case delays of various circuit elements, thereby generating a list of problems that need to be corrected. One common static timing tool developed by IBM is known as EinsTimer. EinsTimer is a sophisticated timing tool that performs static timing analysis on an integrated circuit design to identify potential timing problems with the design. EinsTimer includes sophisticated methods for performing the static timing analysis.

Static timing analysis tools typically operate based on technology rules and user assertions. For a sample design of a circuit, the circuit will have some delay as defined by the technology rules. User assertions define the performance target for the design. Known static timing analysis tools bind user assertions to a "clock" or "phase." For example, the input of a design may expect a signal to arrive at time 100 if it is launched by clock A, but time 200 if launched by clock B. These different user assertions are applied at the same point and are differentiated by their clock. Known static timing analysis tools require clocks to be defined according to an arbitrary name. This can cause problems when two parts of the same design expect the same clock, but under different names. This can happen when a designer imports a logic block provided by a third party into a design. The design may have a clock named CLKA, but the third party logic block may have existing user assertions written in terms of a clock named CLKB. There are two solutions to this problem. The first is to rewrite the existing user assertions for the third party logic block to refer to CLKA instead of CLKB. This is not a viable solution because of the time required to rewrite all of the existing user assertions. In addition, if the third party supplier provides an updated set of user assertions, the effort to rewrite the user assertions will have to be repeated to take advantage of the updated user assertions. A second solution is for a designer to manually create a clock in the design named CLKB that mimics the characteristics of CLKA. However, it is common to have many hundreds of clocks in a design, which puts a significant burden on a designer to manually create many duplicate clocks that mimic the behavior of many other clocks. In addition, the process for manually defining duplicate clocks that mimic other real clocks is time-consuming and prone to user errors.

BRIEF SUMMARY

A timing analysis mechanism allows defining a clock alias that correlates a clock that is not present in the integrated circuit design to a real clock in the integrated circuit design. Clock aliases eliminate the need for a designer to manually create duplicate clocks that mimic the behavior of other real clocks. In a first implementation, when an existing user assertion references a clock alias, the timing analysis mechanism modifies the user assertion to generate a new user assertion that references the real clock specified in the clock alias. The new user assertion is then used in the timing analysis and the original (existing) user assertion is not. The user thus gets appropriate timing using clock names that are standard for the current design while not having to manually modify any original assertions that use a different name for the same clock. In a second implementation, when an existing user assertion references a clock alias, the timing analysis mechanism generates an actual duplicate clock in the timing database for the clock alias. This duplicate clock has all the attributes of the real base clock it mimics, including complicated exclusion, affinity, penalty, etc. relationships with all other clocks in the design. The aliasing mechanism then feeds the original assertions to the timing tool along with the real clock assertions. Both the new user assertion and the original user assertion are then used in the timing analysis. The user is thus prevented from making manual errors when setting up the duplicate clock to match the base clock it mimics. Additionally, the designer who manages the clock definitions does not have to be concerned about making sure to make appropriate and complicated changes to duplicate clock attributes when making updates to the base clock attributes that are often needed as complex designs progress.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

DETAILED DESCRIPTION

The claims and disclosure herein provide a timing analysis mechanism that allows defining one or more clock aliases.

The need for a clock alias arises when a design includes different labels for what should be the same clock. This can happen, for example, when a logic block from a third party is incorporated into a design, and the assertions provided by the third party are in terms of clock labels in the logic block, which may have different clock names that the rest of the design. Clock aliases are used to define a clock in terms of a real clock in the system. In a first implementation, the clock alias causes a user assertion that references the clock alias to be modified to generate a new user assertion that refers instead to the real clock. The new user assertion is then processed. This allows the existing user assertions provided by the third party to be used without the designer having to manually rename the clock names in the existing user assertions and without generating any duplicate real clocks. In a second implementation, the clock alias causes a duplicate clock to be generated in the timing database, and one or more new assertion(s) is/are generated. Both the original and the new assertion(s) are then processed by the timing mechanism. This allows the timing database to track the user assertions that reference a real clock separately from the user assertions that reference a duplicate clock corresponding to a clock alias, which will provide some indication of whether the real clock or the clock alias caused things to happen in the integrated circuit design.

Figure 1:
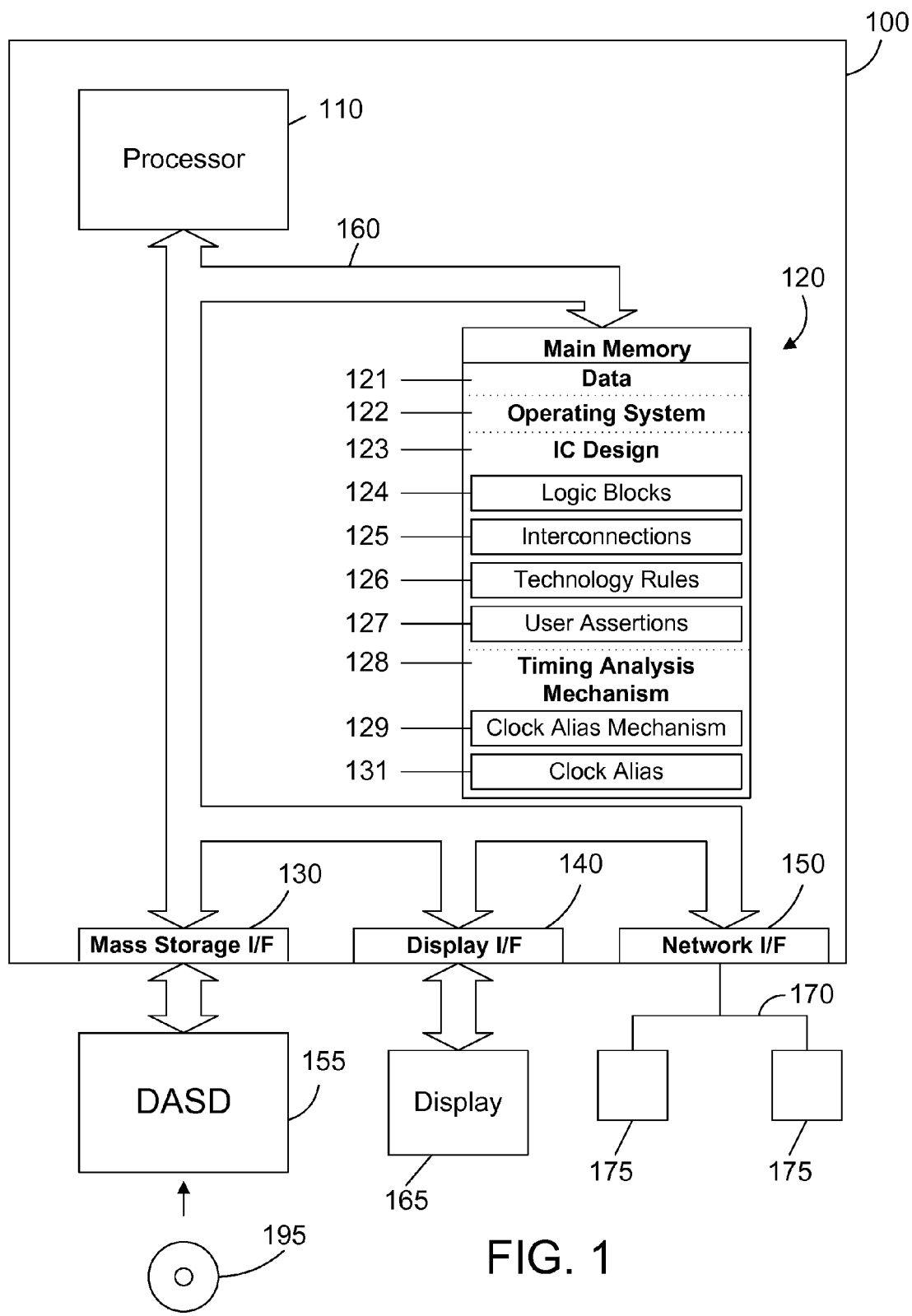
FIG. 1 is a block diagram of an apparatus that performs timing analysis of an integrated circuit design using one or more clock aliases.

Referring to FIG. 1, a computer system 100 is one suitable implementation of a computer system that performs timing analysis of an integrated circuit design. Computer system 100 is an IBM eServer System i computer system. However, those skilled in the art will appreciate that the disclosure herein applies equally to any computer system, regardless of whether the computer system is a complicated multi-user computing apparatus, a single user workstation, or an embedded control system. As shown in FIG. 1, computer system 100 comprises one or more processors 110, a main memory 120, a mass storage interface 130, a display interface 140, and a network interface 150. These system components are interconnected through the use of a system bus 160. Mass storage interface 130 is used to connect mass storage devices, such as a direct access storage device 155, to computer system 100. One specific type of direct access storage device 155 is a readable and writable CD-RW drive, which may store data to and read data from a CD-RW 195.

Main memory 120 preferably contains data 121, an operating system 122, an integrated circuit (IC) design 123, and a timing analysis mechanism 128. Data 121 represents any data that serves as input to or output from any program in computer system 100. Operating system 122 is a multitasking operating system. IC design 123 suitably includes logic blocks 124, interconnections 125, technology rules 126, and user assertions 127. Logic blocks 124 are basic building blocks that typically include transistor structures that define circuit components, such as gates and latches. Interconnections 125 are the connections between the logic blocks 124. Technology rules 126 define the performance for the integrated circuit design, and are based on the selected technology for the integrated circuit. Technology rules 126 typically specify the size of a logic block, and delay characteristics for a logic block. The user assertions 127 are rules provided to define the desired performance of the IC design 123. Often third-party logic blocks are available for incorporation into a design, which may include user assertions 127 pertaining to the logic block. Because the assertions provided by the third party may have clock names that do not match the clock names in the rest of the design, something must be done to account for the different names for the same clock.

Timing analysis mechanism 128 performs static timing analysis on an integrated circuit design 123. When there are different labels in the integrated circuit design that represent the same clock, a clock alias mechanism 129 may be used to create a clock alias 131 so the timing analysis mechanism knows how to perform the timing analysis of the IC design 123. Note that clock alias 131 may be a single clock alias, or may be multiple clock aliases, as required by the user assertions 127 in the IC design 123. The function of the clock alias mechanism 129 and how clock aliases 131 may be used by the timing analysis mechanism 128 are explained in more detail below.

Computer system 100 utilizes well known virtual addressing mechanisms that allow the programs of computer system 100 to behave as if they only have access to a large, single storage entity instead of access to multiple, smaller storage entities such as main memory 120 and DASD device 155. Therefore, while data 121, operating system 122, integrated circuit design 123 and timing analysis mechanism 128 are shown to reside in main memory 120, those skilled in the art will recognize that these items are not necessarily all completely contained in main memory 120 at the same time. It should also be noted that the term "memory" is used herein generically to refer to the entire virtual memory of computer system 100, and may include the virtual memory of other computer systems coupled to computer system 100.

Processor 110 may be constructed from one or more microprocessors and/or integrated circuits. Processor 110 executes program instructions stored in main memory 120. Main memory 120 stores programs and data that processor 110 may access. When computer system 100 starts up, processor 110 initially executes the program instructions that make up operating system 122.

Although computer system 100 is shown to contain only a single processor and a single system bus, those skilled in the art will appreciate that a timing analysis mechanism for an integrated circuit design may be practiced using a computer system that has multiple processors and/or multiple buses. In addition, the interfaces that are used preferably each include separate, fully programmed microprocessors that are used to off-load compute-intensive processing from processor 110. However, those skilled in the art will appreciate that these functions may be performed using I/O adapters as well.

Display interface 140 is used to directly connect one or more displays 165 to computer system 100. These displays 165, which may be non-intelligent (i.e., dumb) terminals or fully programmable workstations, are used to provide system administrators and users the ability to communicate with computer system 100. Note, however, that while display interface 140 is provided to support communication with one or more displays 165, computer system 100 does not necessarily require a display 165, because all needed interaction with users and other processes may occur via network interface 150.

Network interface 150 is used to connect computer system 100 to other computer systems or workstations 175 via network 170. Network interface 150 broadly represents any suitable way to interconnect electronic devices, regardless of whether the network 170 comprises present-day analog and/or digital techniques or via some networking mechanism of the future. Network interface 150 preferably includes a combination of hardware and software that allow communicating on the network 170. Software in the network interface 150 preferably includes a communication manager that manages communication with other computer systems 175 via network 170 using a suitable network protocol. Many different network protocols can be used to implement a network. These protocols are specialized computer programs that allow computers to communicate across a network. TCP/IP (Transmission Control Protocol/Internet Protocol) is an example of a suitable network protocol that may be used by the communication manager within the network interface 150.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 2:
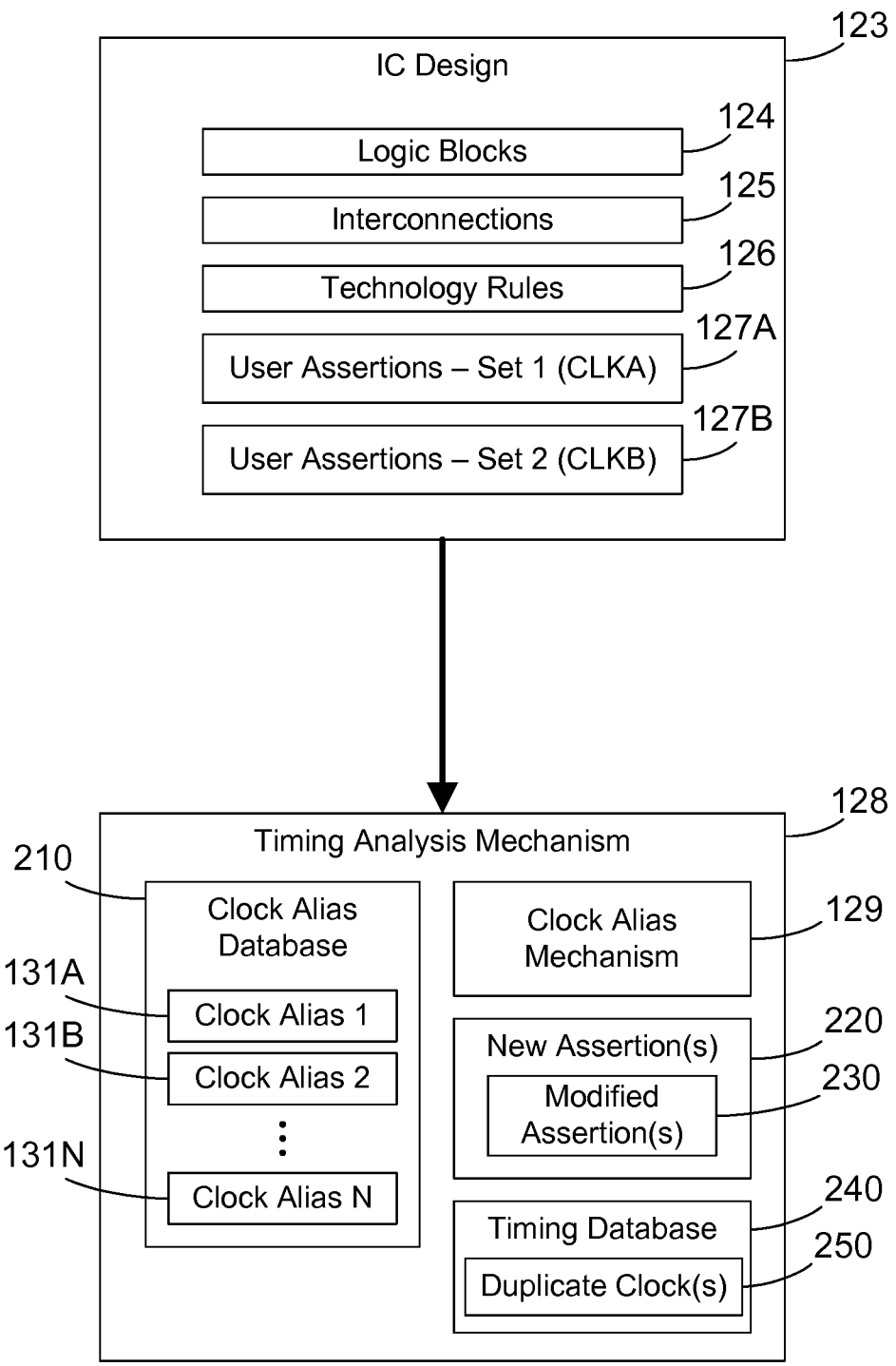
FIG. 2 is a block diagram showing additional features of the integrated circuit design 123 and the timing analysis mechanism 128 in FIG. 1.

Referring to FIG. 2, the IC design 123 may be analyzed by the timing analysis mechanism 128. The IC design 123 includes logic blocks 124, interconnections 125, and technology rules 126 as described above with reference to FIG. 1. We assume the user assertions 127 in FIG. 1 include a first set of user assertions 127A that refer to a clock as CLKA, and a second set of user assertions 127B that refer to the same clock as CLKB.

The timing analysis mechanism 128 includes a clock alias database 210 that includes multiple clock aliases 131, shown in FIG. 2 as clock alias 131A, clock alias 131B, . . . , clock alias 131N. The clock alias mechanism 129 is used to generate the clock aliases. The timing analysis mechanism 128 may be implemented to function in at least two different ways, discussed in detail below. A first implementation modifies an existing user assertion that references a clock alias to produce a modified assertion 230 that references a real clock instead. This allows user assertions that do not reference a real clock to be used by substituting the real clock specified in the clock alias in the user assertion. Note the modified assertion 230 is a new assertion 220 within the scope of the disclosure and claims herein. A second implementation generates a duplicate clock 250 in the timing database 240, and creates from an existing user assertion that references a clock alias a new assertion 220 for the real clock in the clock alias. The timing analysis mechanism 128 will then process the original user assertion in 127B for the duplicate clock, and the new user assertion 220 for the real clock in performing the timing analysis of the integrated circuit design.

Figures 3, 4:
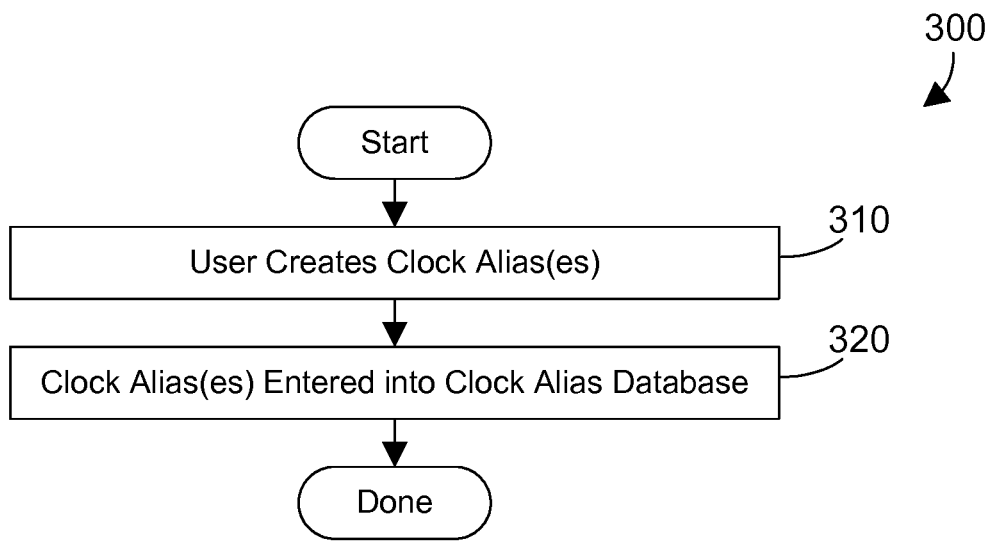
FIG. 3 is a flow diagram of a method to create one or more clock aliases.
FIG. 4 is a sample command for creating a clock alias.

Referring to FIG. 3, a method 300 for defining one or more clock aliases begins with a user creating one or more clock aliases (step 310). The clock aliases are then entered into the clock alias database (step 320). Once the clock aliases are stored in the clock alias database, the timing analysis mechanism can use the clock aliases in performing the timing analysis of the integrated circuit design.

FIG. 4 shows one suitable command 410 for a user to create a clock alias in step 310 in FIG. 3. A create_alias command is defined by the clock alias mechanism 129, with the first parameter referring to the real clock and the second parameter referring to the clock label that is used in some user assertions (e.g., 127B in FIG. 2) that does not represent a real clock in the integrated circuit design. Thus, when the user executes the create_alias CLKA CLKB command 410 shown in FIG. 4 in step 310 in FIG. 3, step 320 will create an entry in the clock alias database 210 that correlates the real clock CLKA to the alias CLKB. In the simplest implementation, each entry in the clock alias database is a tuple that specifies a real clock and an alias. This information allows correlating the alias CLKB with the real clock CLKA. Of course, other additional information could also be included in the clock alias database 210 within the scope of the disclosure and claims herein.

Figure 5:
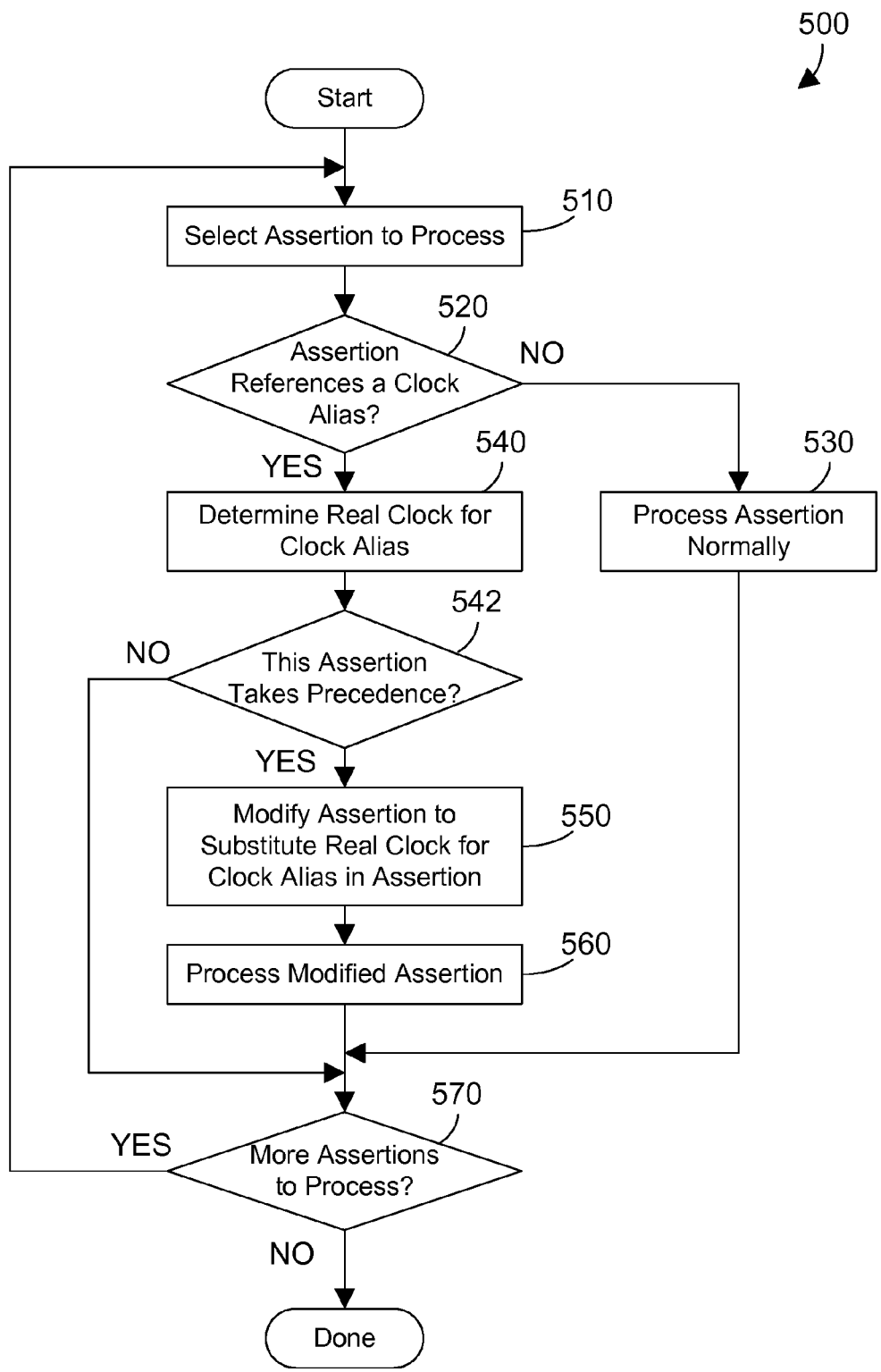
FIG. 5 is a flow diagram of a first method for using a clock alias in timing analysis of an integrated circuit design.

The timing analysis mechanism may be implemented in two different ways to use clock aliases. In the first implementation described in FIGS. 5 and 6, an existing user assertion that references a clock alias is modified to generate a new user assertion that references the real clock specified in the clock alias. Referring to FIG. 5, method 500 begins by selecting a user assertion to process (step 510). If the user assertion does not reference a clock alias (step 520=NO), this means the assertion references a real clock, and the assertion can then be processed normally (step 530). Method 500 is then done. If the selected assertion references a clock alias (step 520=YES), the real clock corresponding to the clock alias is determined (step 540). The real clock corresponding to a clock alias can be easily determined by looking at the definition of the clock alias in the clock alias database 210 in FIG. 2. If this assertion takes precedence (step 542=YES), the selected assertion is modified to substitute the real clock for the clock alias in the assertion (step 550). The modified assertion is then processed by the timing analysis mechanism (step 560). If this assertion does not take precedence over a previous assertion (step 542=NO), steps 550 and 560 are skipped. In the first implementation the assertion that referenced a clock alias is replaced with an assertion that references a real clock if the assertion takes precedence over one or more previous assertions. The result is that all user assertions, after the processing in method 500, will reference a real clock in the integrated circuit design.

Figure 6:
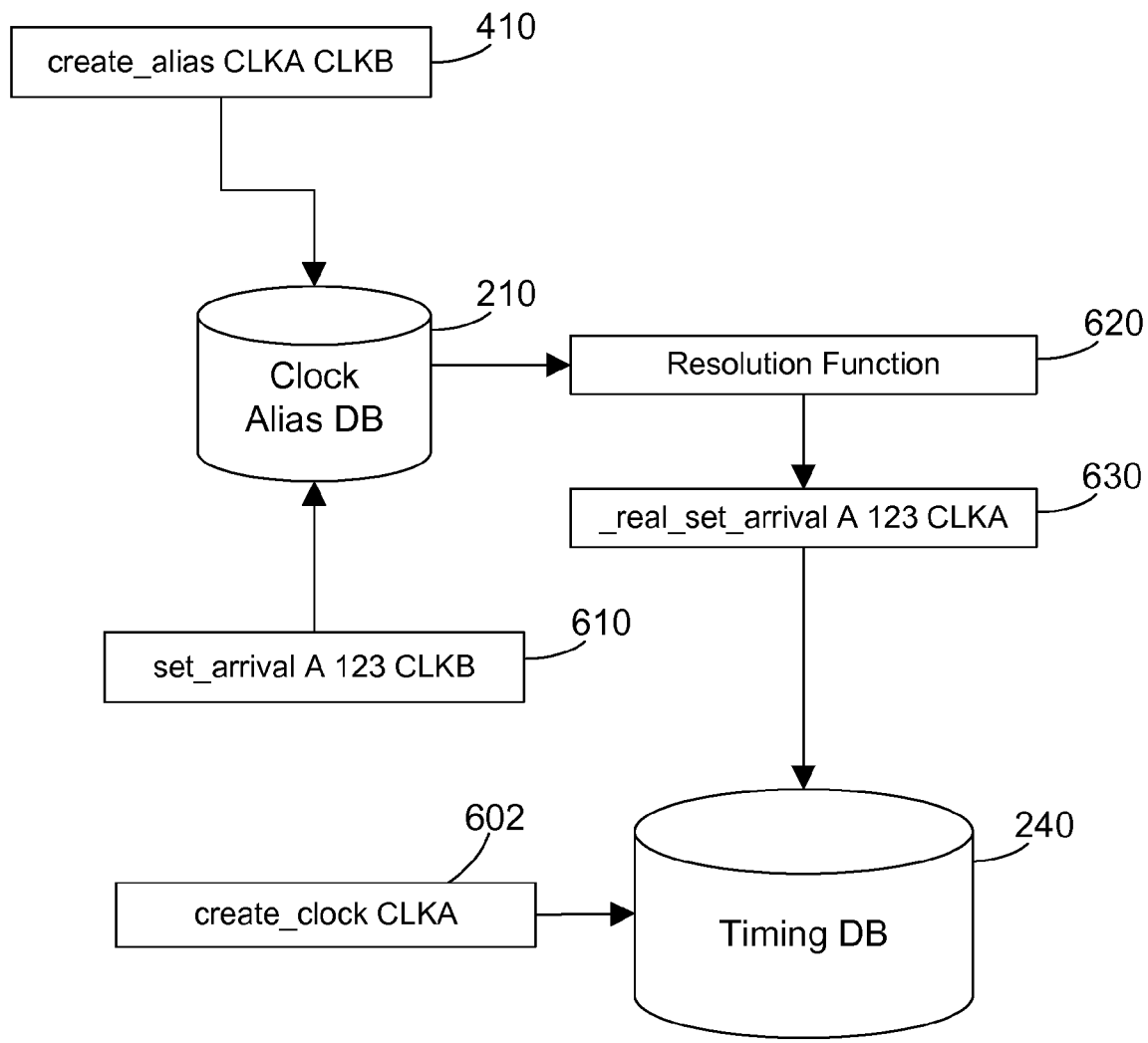
FIG. 6 is a block diagram representing the first method in FIG. 5.

A simple block diagram in FIG. 6 shows the operation of methods 300 in FIG. 3 and 500 in FIG. 5. We assume at the outset a real clock CLKA is defined by the command create_clock CLKA shown at 602. In step 310 in FIG. 3, the user executes the clock alias command 410 in FIG. 4. In response, in step 320 the clock alias mechanism 129 creates an entry in the clock alias database 210 that correlates the real clock CLKA to the alias CLKB. When a user assertion 610 that is in terms of the clock alias CLKB is to be processed (step 510 and step 520=YES), the clock alias database 210 is consulted to determine the real clock that corresponds to the alias CLKB, namely CLKA (step 540). Next, if there are any previous assertions that conflict with the application of the new assertion, a resolution function is applied in 620 in FIG. 6 to determine which assertion takes precedence (step 542 in FIG. 5). One suitable way to resolve conflicting assertions in step 542 in FIG. 5 (block 620 in FIG. 6) is for the last assertion in time to override previous assertions. Another suitable way to resolve conflicting assertions is to give more weight to the real clock such that an equivalent assertion using an alias with a different value is not used if the real clock is already asserted. Yet another suitable way to resolve conflicting assertions is to use the most restrictive assertion. Of course, other heuristics could be used in resolving assertions to determine which takes precedence in step 542 in FIG. 5 and block 620 in FIG. 6. In the case where the resolution function determines that some other assertion takes precedence over the current assertion, the resolution function alerts the user to this fact so as to avoid ambiguity about which assertions are actually responsible for the timing results presented at the end of the analysis. The disclosure and claims herein extend to any suitable way to resolve conflicting assertions.

When the current assertion takes precedence, the assertion is modified to generate a new assertion that substitutes the real clock CLKA for the clock alias CLKB in the original assertion (step 550). The result is modified assertion 630, which is a new assertion that did not exist before in either set 127A or 127B in FIG. 2. The modified assertion 630 is then processed to the timing database 240 during the timing analysis of the integrated circuit design (step 560). The first implementation described above has the advantage of simplicity and increased performance. Because existing user assertions that reference a clock alias can be processed on-the-fly without the need for the user to create duplicate clocks and without the user having to rename the clock alias labels in the user assertions, the result is a timing analysis system that is very efficient. Note, however, the timing analysis in the timing database 240 cannot tell the difference between a real clock and a clock alias because all of the clock aliases were converted to real clocks in the modified assertions. Thus, if there are errors in the timing database 240, the user may not be able to easily tell whether the user assertion that was the cause of the error was in the first set of user assertions 127A that were provided by the user, or in the second set of user assertions 127B that were provided by a third party supplier of a logic block used in the integrated circuit design.

Figure 7:
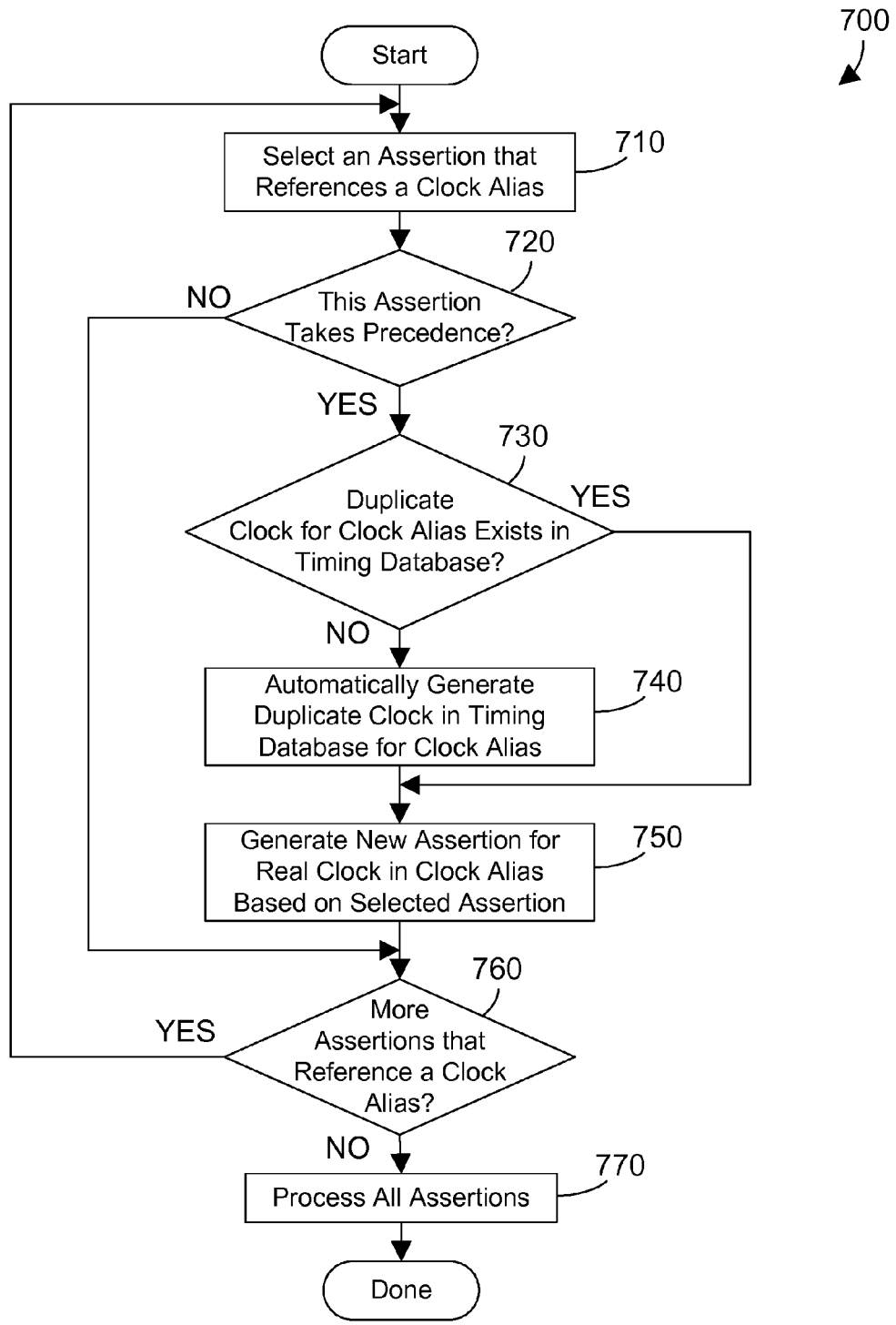
FIG. 7 is a flow diagram of a second method for using a clock alias in timing analysis of an integrated circuit design.
Figure 8:
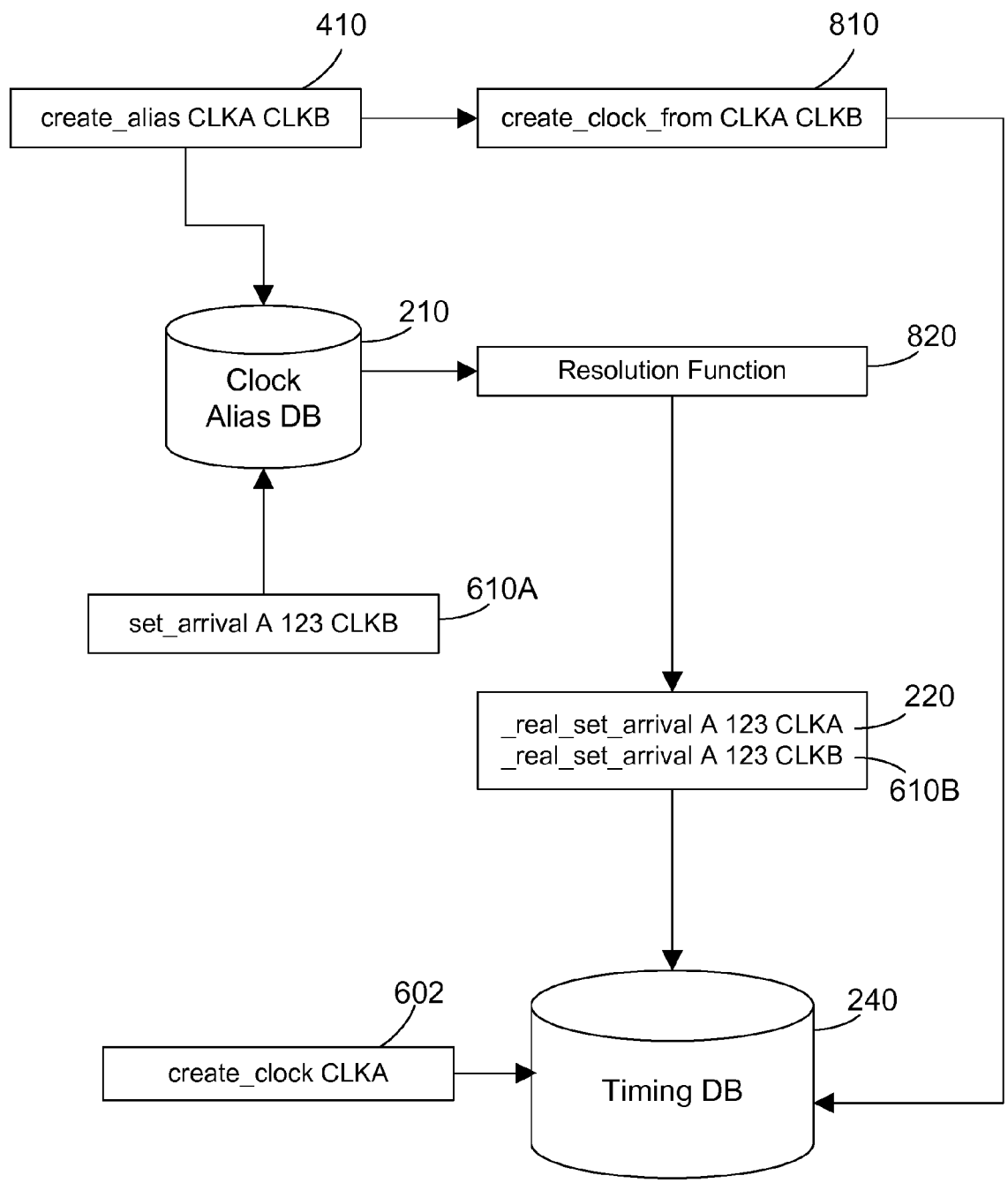
FIG. 8 is a block diagram representing the second method in FIG. 7.

The second implementation is shown in FIGS. 7 and 8. Referring to FIG. 7, a method 700 begins by selecting a user assertion that references a clock alias (step 710). Next, the resolution function determines whether this assertion has precedence over any previous assertions (step 720). Step 720 is similar to step 542 in FIG. 5 described in detail above. Any suitable heuristic could be used to determine whether this assertion has precedence over any previous assertions in step 720. For example, the last assertion in time could override (take precedence) over previous assertions. An assertion with a real clock could be given precedence over an assertion with a clock alias. And an assertion that is more restrictive could take precedence over less restrictive assertions. If this assertion takes precedence (step 720=YES), and if the clock alias does not have a duplicate real clock in the timing database (step 730=NO), a duplicate clock is automatically generated in the timing database for the clock alias (step 740). If the duplicate clock already exists (step 730=YES), step 740 may be skipped. A new assertion is then generated for the real clock in the clock alias based on the selected assertion (step 750). At this point both the assertion selected in step 710 and the new assertion created by step 750 will be ready for processing by step 770. If this assertion does not take precedence over a previous assertion (step 720=NO), method 700 goes to step 760 and continues. If there are more assertions that reference a clock alias that need to be processed (step 760=YES), method 700 loops back to step 710 and continues until there are no more assertions that reference a clock alias that need to be processed (step 760=NO). Once the processing in steps 710-760 is complete, all the assertions are then processed (step 770). Note the assertions included in the processing in step 770 include the existing assertions 127A and 127B in FIG. 2, plus any new assertions that were generated in step 750 for real clocks. The principle behind method 700 is very simple: for every user assertion that references a clock alias, create a duplicate clock for that clock alias, and create a new similar assertion for the real clock. In this manner, all assertions for both real clocks and for duplicate clocks are performed on the all the real clocks.

A simple block diagram in FIG. 8 shows the operation of methods 300 in FIG. 3 and 700 in FIG. 7. We assume at the outset a real clock CLKA is defined by the command create_clock CLKA shown at 602. In step 310 in FIG. 3, the user executes the clock alias command 410 in FIG. 4. In response, in step 320 the clock alias mechanism 129 creates an entry in the clock alias database 210 that correlates the real clock CLKA to the alias CLKB. A user assertion 610A that is in terms of the clock alias CLKB is selected to be processed (step 710). If there are previous assertions that conflict with this assertion, the resolution function 820 determines whether this assertion takes precedence (step 720). If so (step 720=YES), the timing database is checked to see if a duplicate clock for CLKB exists (step 730). We assume for this example that no such duplicate clock exists (step 730=NO). A duplicate clock CLKB is then automatically generated in the timing database to mimic the real clock CLKA (step 740). For the specific example in FIG. 8, step 740 is performed by executing the command create_clock from CLKA CLKB 810. The timing database 240 will now include a real clock CLKA and a duplicate real clock CLKB that mimics CLKA. A new assertion 220 is then generated from the original assertion 610A that references the real clock CLKA (step 750). The existing assertion 610A is also used as shown at 610B. Both assertions 220 and 610B will be processed, because each is now in terms of a real clock in the timing database 240. We assume there are no more assertions that reference a clock alias to process (step 760=NO), so the two assertions 220 and 610B shown in FIG. 8 will be processed by the timing analysis mechanism (step 770).

The second implementation creates many copies of clocks in the timing database, and it therefore does not provide the processing efficiencies present in the first implementation. However, the timing database 240 will include timing for all real clocks and all duplicate clocks corresponding to clock aliases, allowing the user to easily determine whether an assertion in set 127A or an assertion in set 127B created a particular timing problem in the integrated circuit design. In addition, the user is spared the risk of error in making complicated manual copies of real clocks and from having to replicate complicated changes to the definition of the real clock to a potentially large number of alias clocks.

The ability to create clock aliases as described herein gives rise to the concept of "chained aliases." For example, let's assume the following three commands are provided by a designer:

```
create_clock CLKA
create_alias CLKA CLKB
create_alias CLKB CLKC
```

The first creates a real clock CLKA. The second creates a clock alias CLKB from the real clock CLKA. The third creates a clock alias CLKC from the clock alias CLKB. Clocks CLKA, CLKB and CLKC are all equivalent, but CLKC is aliased to an alias instead of to a real clock. This may be desirable due to nested assertions from multiple pieces of third party logic, or for other reasons. In the first implementation described above in FIGS. 5 and 6, the command create_alias CLKB CLKC is changed to create_alias CLKA CLKC to link CLKC to the real clock CLKA. In the second implementation described above in FIGS. 7 and 8, an additional assertion_real_set_arrival A 123 CLKC will be added to the assertions 220 and 610B that are generated as shown in FIG. 8. The resolution function will be applied to the CLKC assertion just as it would be applied to the CLKB assertion.

The timing analysis mechanism described and claimed herein provides a way to generate clock aliases that correlate a real clock to a clock alias. In both implementations, the processing of a clock alias generates a new user assertion that references the real clock. The timing analysis mechanism thus supports using user assertions for a third party logic block that are in terms of a different clock label than the rest of the design without the user having to manually duplicate clocks in the timing database and without the user having to manually change the different clock label to the same clock label used in the rest of the design.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An apparatus comprising:
   at least one processor;
   a memory coupled to the at least one processor;
   an integrated circuit design residing in the memory, the integrated circuit design comprising a plurality of user assertions that each define a performance target for the integrated circuit design, the plurality of user assertions including a first user assertion that references a first clock and a second user assertion that references a second clock, wherein the first clock is a real clock in the integrated circuit design and the second clock does not correspond to a real clock in the integrated circuit design;
   a clock alias mechanism that creates a clock alias that correlates the second clock to the first clock; and
   a timing analysis mechanism that performs the steps of:
   (A) reading the plurality of user assertions for the integrated circuit design from the memory;
   (B) reading the clock alias that correlates the second clock to the first clock;
   (C) selecting a user assertion that references the clock alias;
   (D) determining whether a duplicate clock for the clock alias exists in a timing database in the integrated circuit design;
   (E) when a duplicate clock for the clock alias does not exist in the timing database, automatically generating the duplicate clock for the clock alias in the timing database that mimics the first clock;
   (F) generating a new user assertion for the first clock based on the user assertion selected in step (C);
   (G) when all assertions that reference any clock alias have been processed in steps (B) through (F), processing the plurality of user assertions read in step (A) and processing all new user assertions generated in step (F).

2. An article of manufacture comprising software stored on non-transitory recordable media, the software comprising:
   a clock alias mechanism that reads an integrated circuit design comprising a plurality of user assertions that each define a performance target for the integrated circuit design, the plurality of user assertions including a first user assertion that references a first clock and a second user assertion that references a second clock, wherein the first clock is a real clock in the integrated circuit design and the second clock does not correspond to a real clock in the integrated circuit design, wherein the clock alias mechanism creates a clock alias that correlates the second clock to the first clock; and a timing analysis mechanism that performs the steps of:
- (A) reading the plurality of user assertions for the integrated circuit design;
- (B) reading the clock alias that correlates the second clock to the first clock;
- (C) selecting a user assertion that references the clock alias;
- (D) determining whether a duplicate clock for the clock alias exists in a timing database in the integrated circuit design;
- (E) when a duplicate clock for the clock alias does not exist in the timing database, automatically generating the duplicate clock for the clock alias in the timing database that mimics the first clock;
- (F) generating a new user assertion for the first clock based on the user assertion selected in step (C);
- (G) when all assertions that reference any clock alias have been processed in steps (B) through (F), processing the plurality of user assertions read in step (A) and processing all new user assertions generated in step (F).

* * * * *